United States Patent [19]

Weissmueller

[11] 4,334,174

[45] Jun. 8, 1982

[54] SAWTOOTH WAVEFORM GENERATION FOR A TELEVISION RECEIVER

[75] Inventor: William R. Weissmueller, Wildwood, Ill.

[73] Assignee: Zenith Radio Corporation, Glenview, Ill.

[21] Appl. No.: 77,684

[22] Filed: Sep. 21, 1979

[51] Int. Cl.$^3$ .................... H01J 29/70; H01J 29/76
[52] U.S. Cl. .................................. 315/408; 307/228
[58] Field of Search ............... 315/408, 403, 409, 410; 307/228

[56] References Cited

U.S. PATENT DOCUMENTS

| | | | |
|---|---|---|---|
| 3,484,624 | 12/1969 | Rasiel et al. | 307/228 |
| 3,659,115 | 4/1972 | Montgomery | 307/228 |
| 4,047,052 | 9/1977 | Koubek et al. | 307/228 |

*Primary Examiner*—Theodore M. Blum

*Attorney, Agent, or Firm*—Jack Kail; John H. Moore

[57] ABSTRACT

A method and electronic circuit are described for generating a sawtooth waveform for vertical deflection of a television receiver's cathode ray tube. The method is effected by a circuit which includes a single capacitor which is charged to develop the ramp portion of the sawtooth. In response to a vertical sync pulse, the circuit discharges the capacitor and compares the capacitor's discharge voltage to a predetermined threshold voltage. When the latter two voltages are substantially equal to each other, discharge of the capacitor is discontinued, thus generating a sawtooth waveform across the capacitor. The capacitor begins charging again to form another ramp voltage and is discharged on receipt of the next vertical sync pulse. The charge and discharge of the capacitor repeats as successive vertical sync pulses are received.

1 Claim, 3 Drawing Figures

SAWTOOTH WAVEFORM GENERATION FOR A TELEVISION RECEIVER

BACKGROUND OF THE INVENTION

The present invention is directed generally to improvements in television receivers, and particularly to a novel sawtooth generator for use in the vertical deflection portion of a television receiver.

Conventionally, television receivers include a cathode ray tube which develops a raster scan in response to vertical and horizontal deflection currents applied to a yoke. Those deflection currents are synchronized with incoming vertical and horizontal sync pulses received as part of a composite television signal.

In some receivers, a vertical oscillator is included for developing a sawtooth waveform which is applied to the yoke. U.S. Pat. No. 3,863,106 illustrates one such vertical oscillator. In other receivers, a vertical oscillator is not used. Instead, a countdown circuit is included which generates local clock pulses of twice the standard television line frequency. The clock pulses are counted and an internal vertical sync pulse is generated when a count indicative of the proper line rate/frame rate ratio (525 for NTSC systems) is reached. The internally generated sync pulse is applied to a sawtooth generator for developing a sawtooth waveform which is employed to control vertical deflection of the cathode ray tube. U.S. Pat. Nos. 3,691,297 and 3,916,102 disclose typical countdown systems of this type. An improved countdown system is disclosed in U.S. application Ser. No. 42,697, filed May 25, 1979, entitled VERTICAL SYNCHRONIZATION SYSTEM.

In television receivers employing a countdown circuit rather than a vertical oscillator, the internally generated vertical sync pulse is typically applied to an edge-triggered monostable multivibrator to generate a rectangular pulse of a predetermined duration. The latter pulse is then applied to a sawtooth waveform generator which provides vertical deflection of the cathode ray tube.

Although the use of a monostable driving a sawtooth waveform generator is satisfactory from a performance standpoint, it suffers from being somewhat expensive. For example, the monostable multivibrator usually employs a resistance-capacitance network to establish a predetermined time constant for the multivibrator. That time constant determines the duration of the pulse generated by the multivibrator.

In the sawtooth waveform generator, another capacitor is usually included for integrating the pulse provided by the multivibrator to develop a sawtooth waveform. Thus, the multivibrator-sawtooth generator combination requires two capacitors. When the vertical deflection circuitry is fabricated as an integrated circuit, the two capacitors are usually "discrete" and coupled to the integrated circuit by a pair of pin connections. The inclusion of two such pin connections obviously raises the cost of the integrated circuit. The cost of the two discrete capacitors raises the cost of the receiver even further. Hence, even though the multi-vibrator-sawtooth waveform generator performs satisfactorily in a receiver employing a vertical countdown system, its expense is a definite disadvantage.

OBJECTS OF THE INVENTION

It is a general object of the invention to provide an improved method and apparatus for generating a sawtooth waveform so as to duplicate the function of a conventional multivibrator-sawtooth generator combination in a receiver employing a vertical countdown system, but at less expense.

It is another object of the invention to provide a circuit which is responsive to a vertical sync pulse for providing a sawtooth waveform for vertical deflection of a television receiver's cathode ray tube, which circuit employs but a single resistance-capacitance network.

It is a further object of the invention to provide such a circuit which is easily integratable and which requires but a single pin connection to a discrete capacitor.

BRIEF DESCRIPTION OF THE FIGURES

The objects stated above and other objects of the invention are set forth more particularly in the following detailed description and in the accompanying drawings, of which.

DESCRIPTION OF THE PREFERRED EMBODIMENT

Figure 1:
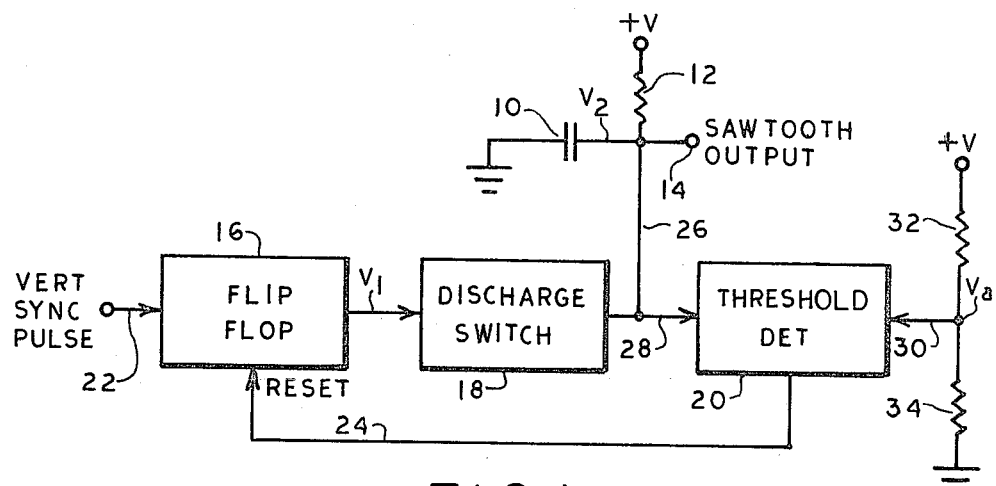
FIG. 1 is a diagram, partly in block form, illustrating a circuit for generating a sawtooth waveform according to the invention.

Referring now to FIG. 1, there is shown a diagram of a sawtooth generating system which uses but a single capacitor 10 for developing a sawtooth waveform to control vertical deflection of a cathode ray tube in a television receiver. The capacitor 10 is coupled between ground and a positive voltage supply via a charging resistor 12. Hence, current flows through the resistor 12 to the capacitor 10 and charges the capacitor such that a ramp voltage is developed across the capacitor.

Figure 2:
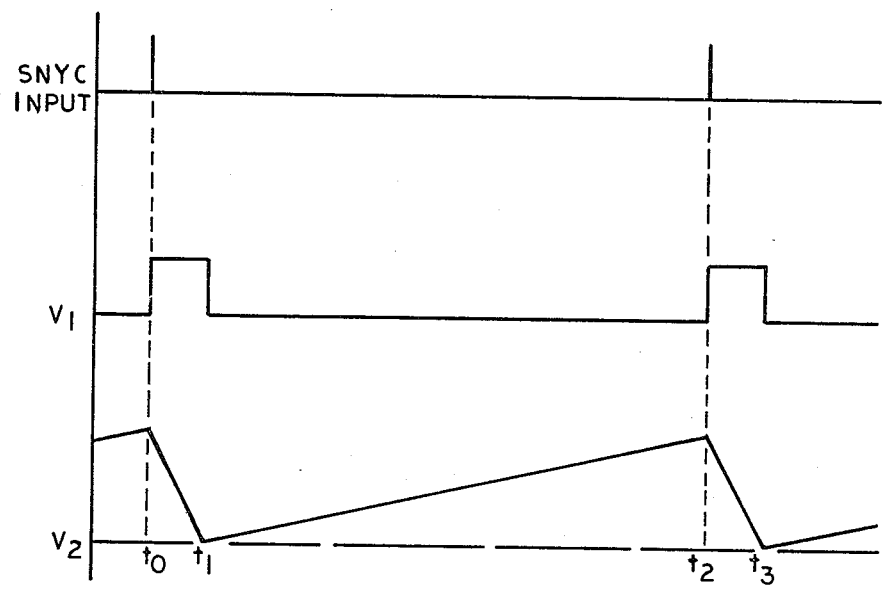
FIG. 2 illustrates various waveforms useful in describing the operation of the circuit shown in FIG. 1.

As shown by the voltage waveform $V_2$ in FIG. 2, a ramp voltage is developed across the capacitor 10 between times $t_1$ and $t_2$ due to the above-mentioned current flow through the resistor 12. This ramp waveform is employed to control vertical deflection of a cathode ray tube during the trace time of a television receiver. To effect retrace deflection of the cathode ray tube, the capacitor is discharged as described below between times $t_2$ and $t_3$ to form the conventional sawtooth waveform. At time $t_3$, the capacitor is permitted to begin charging again to form another ramp waveform. The cycle of charge and discharge is continued periodically at a vertical repetition rate to continuously generate a sawtooth waveform across the capacitor 10 and at an output terminal 14 for application to deflection circuitry.

The method by which the timing of the charge and discharge of the capacitor is controlled in the illustrated system includes initiating discharge of the capacitor 10 in response to the receipt of a vertical sync pulse. As the capacitor 10 discharges to a predetermined threshold voltage, the system generates a reset signal for discontinuing discharge of the capacitor 10, whereupon the capacitor starts charging again.

In the illustrated embodiment, controlled discharge of the capacitor 10 is effected by a bi-stable device 16, shown as a conventional flip-flop, and a discharge switch 18. Generally, the discharge switch 18 operates to initiate and discontinue discharge of the capacitor 10 upon command of the flip-flop 16. The flip-flop 16 is, in turn, actuated by a reset signal developed by a threshold detector 20 and vertical sync pulses received at its set input lead 22.

More specifically, the flip-flop 16 is adapted to receive a vertical sync pulse via the lead 22 for assuming a first operating condition. For example, the flip-flop 16 may respond to a vertical sync pulse by generating an output voltage $V_1$ which rises from a relatively low level to a relatively high level, as shown by waveform $V_1$ of FIG. 2.

The flip-flop 16 is also adapted to receive a reset signal via a lead 24 for assuming a second operating condition, as by its output $V_1$ going from a high level to a low level as shown at time $t_1$ in FIG. 2. As is explained in more detail below, the capacitor 10 is permitted to charge when the voltage $V_1$ is at a low level and is caused to discharge rapidly when the voltage $V_1$ is at a high level.

The discharge switch 18 receives the voltage $V_1$ and responds to that voltage being at a high level by rapidly discharging the capacitor 10 via a lead 26. When the voltage $V_1$ assumes a lower level, the discharge switch 18 discontinues the discharge of the capacitor 10 and permits it to recharge through the resistor 12, whereupon the capacitor begins developing another ramp waveform.

To determine when the discharge of capacitor 10 should be terminated, the threshold detector 20 senses the voltage across the capacitor via a lead 28, senses via lead 30 a threshold voltage $V_a$ developed by a voltage divider comprising resistors 32 and 34, and compares the voltage across the capacitor to the threshold voltage. The value of the threshold voltage $V_a$ determines the desired value of the sawtooth voltage when discharge of the capacitor 10 is to be terminated. When substantial equality is detected between the capacitor's voltage and the threshold voltage, the detector 20 generates a reset signal on the lead 24.

In response to the reset signal, the flip-flop 16 assumes its second operating condition wherein its output voltage $V_1$ drops to a low value. The switch 18 then discontinues discharge of the capacitor 10 and the latter begins charging to form another ramp waveform.

The repetitive nature of sawtooth waveform generation is shown in FIG. 2. Assuming that the capacitor 10 is charging prior to time $t_0$, and that a vertical sync pulse is received at time $t_0$, the output voltage $V_1$ rises to a relatively high level for actuating the switch 18. Consequently, the switch 18 begins discharging the capacitor 10. When the value of the capacitor voltage decreases to the value of the threshold voltage $V_a$ at time $t_1$, the threshold detector 20 generates a reset signal for resetting the flip flop 16. The resultant low output of the flip-flop 16 turns off or opens the switch 18 at time $t_1$ to permit the capacitor to begin charging again.

At time $t_2$, another vertical sync pulse is received, whereupon the voltage $V_1$ rises and the switch 18 discharges the capacitor 10 toward $V_a$. When the threshold value is reached, the detector 20 generates another reset signal at time $t_3$ for resuming the charging cycle. This operation continues repetitively for developing a succession of periodic sawtooth waveforms at the terminal 14.

By virtue of the arrangement described above, the generation of a sawtooth waveform and the timing of the charge and discharge portions thereof are effected by a relatively simple method and circuit which requires but a single capacitor. Hence, an embodiment which is fabricated in integrated circuit form need employ but a single pin connection for coupling to the capacitor 10. The remainder of the system of FIG. 1 is readily constructed on an integrated circuit chip.

Figure 3:
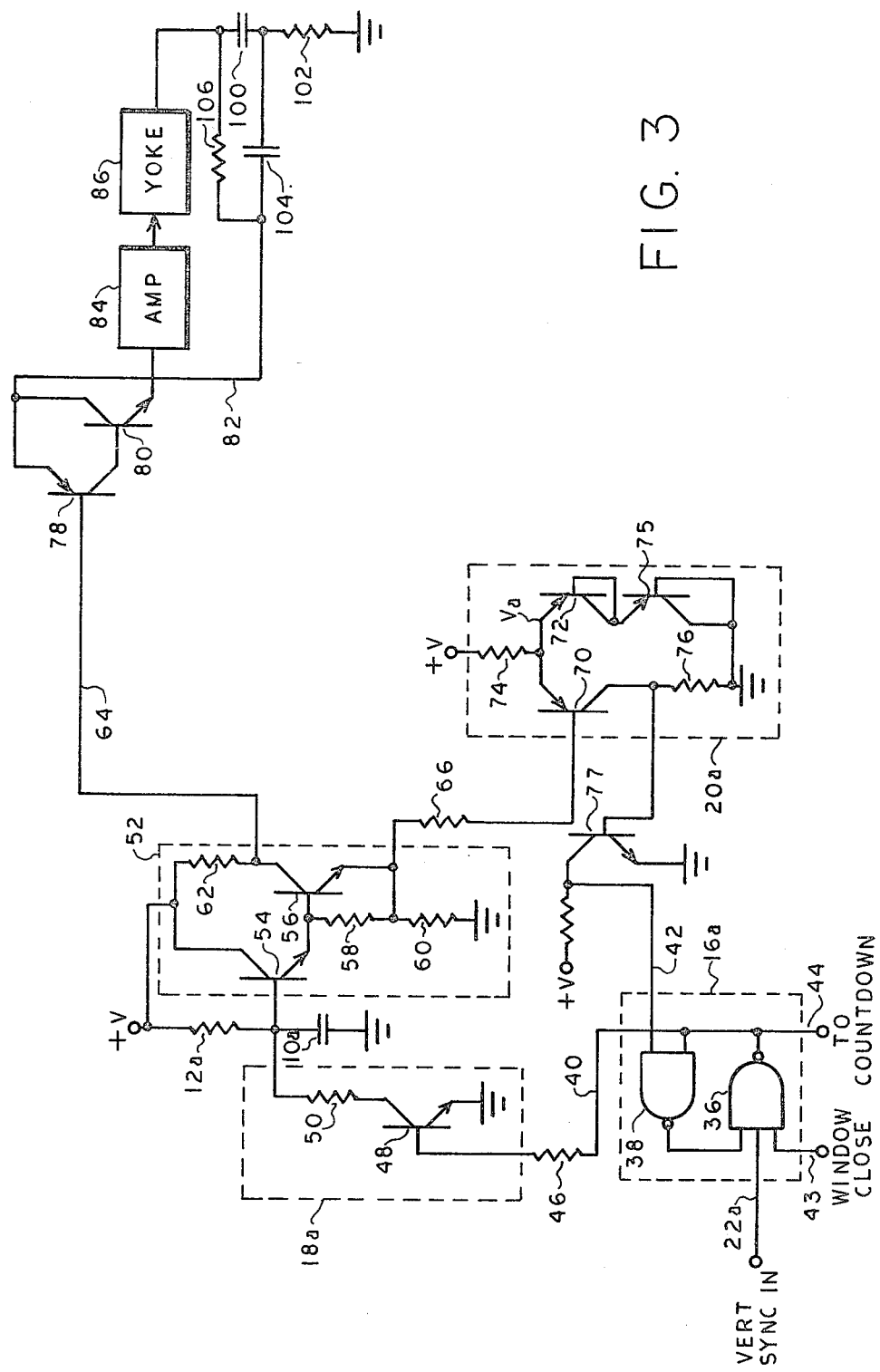
FIG. 3 is a detailed circuit diagram of a sawtooth generating circuit of the type shown in FIG. 1.

Referring now to FIG. 3, there is shown an embodiment of the invention which effects the charge and discharge steps described above but which has been specifically designed for fabrication on an integrated circuit chip. In addition, this particular embodiment is designed for use in a television receiver employing a vertical countdown system of the type previously described.

Elements of the FIG. 3 embodiment which perform the function of corresponding elements in FIG. 2 are given corresponding reference numbers. For example, the function of the flip-flop 16 of FIG. 1 is effected by the flip-flop 16a of FIG. 3.

As shown, a vertical sync input is provided via a lead 22a to a NAND gate 36 which is coupled with another NAND gate 38 to form a latching flip-flop 16a. With this arrangement, receipt of a vertical sync pulse causes the output of the gate 36 to latch high at lead 40. A reset lead 42 is coupled to one input of the gate 38 such that the lead 40 is latched low when the flip-flop 16a receives a reset signal.

The gate 36 also includes another input lead 43 for receipt of a "window close" signal from a vertical countdown circuit (not shown) of the type described in the above-mentioned application Ser. No. 42,697, the teachings of which are incorporated herein. That type of countdown circuit outputs a vertical sync pulse for application to the lead 22a whenever the countdown circuit receives a vertical sync pulse within a predetermined time "window". If no such sync pulse is received within the window, the countdown circuit generates a "window close" signal and outputs no vertical sync pulse. In the embodiment of FIG. 3 herein, the gate 36 is adapted to receive from a vertical countdown circuit either a vertical sync pulse at lead 22a or a "window close" pulse at lead 43. Either such pulse will cause the output lead 40 to latch high for initiating discharge of the capacitor 10a. Because either a window close signal or a vertical sync pulse cause the flip-flop 16a to latch, both those signals are referred to hereinafter as vertical sync pulses for brevity.

It will be appreciated that the flip-flop 16a may receive a vertical sync pulse having multiple edges. However, the first edge of a received sync pulse causes the flip-flop to latch. To indicate such latching, the flip-flop 16a may provide another output lead 44 for application to the countdown circuit. The signal on the latter lead may be employed to shut down the countdown circuits, i.e., avoid transmission of further sync pulse edges to the flip-flop 16a until the next time "window" occurs.

The output of the flip-flop 16a on lead 40 is coupled via a resistor 46 to a discharge switch 18a comprising a transistor 48 and a collector resistor 50. The resistor 50 is coupled to the junction between the capacitor 10a and the charging resistor 12a. In response to a high level signal on the lead 40, the transistor 48 conducts charge from the capacitor 10a, through the resistor 50, and thence to ground.

To ensure that the capacitor 10a is discharged much faster than it is charged through the resistor 12a, the value of the resistor 50 is selected to be much smaller than the value of the resistor 12a. The discharge rate of the capacitor 10a is, therefore, dependent on the values of the capacitor 10a and the resistor 50.

Rather than coupling the voltage across the capacitor 10a directly to a threshold detector as was done in the embodiment of FIG. 1, an inverter 52 receives the sawtooth waveform from the capacitor 10a for providing an inverted sawtooth waveform output and a non-inverted sawtooth waveform output, the latter of which is applied to the threshold detector 20a.

More specifically, the inverter 52 includes a pair of transistors 54 and 56 interconnected as shown with resistors 58, 60 and 62. The sawtooth waveform received by the base of the transistor 54 is inverted at the collector of the transistor 56 and applied via a lead 64 to further circuitry described hereinafter. A non-inverted sawtooth waveform is developed at the emitter of the transistor 56 and coupled via a resistor 66 to the detector 20a. With this arrangement, the inverter 52 does not change the operation of waveform generation. It merely provides an additional sawtooth waveform whose sense or polarity is inverted for further processing.

The detector 20a includes a pair of transistors 70 and 72 coupled together as shown with a common emitter resistor 74. The base and collector of the transistor 72 are connected to each other and to the emitter of another diode-connected transistor 75. The base and collector of the latter transistor are grounded, as a result of which a threshold voltage $V_a$ of approximately 1.2 volts is developed at the emitters of the transistors 70 and 72.

When the value of the sawtooth waveform at the base of the transistor 70 is positive with respect to the voltage $V_a$, the transistor 70 is "off". Hence, a relatively low level signal appears across its collector load resistor 76. That low level signal is received by another transistor 77 which translates it to a high level signal for application to one input of the gate 38 via the lead 42 for holding the flip-flop 16a latched high at its output on lead 40.

As the capacitor 10a discharges, its sawtooth waveform goes more negative and eventually reaches a value less than the value of $V_a$. On that occurrence, the transistor 70 turns on, thereby developing a high level signal across the resistor 76. The transistor 77 then develops a low level signal on the lead 42 for resetting the flip-flop 16a. Consequently, the lead 40 is latched low to terminate discharge of the capacitor 10a. As described above with reference to FIG. 1, the cycle repeats periodically to develop a succession of sawtooth waveforms.

The inverted waveform generated on the lead 64 may be applied to a difference amplifier comprising transistors 78 and 80. The latter are coupled together as a so-called compound emitter follower wherein the base of the transistor 78 receives the inverted sawtooth waveform and its emitter receives another signal via a lead 82.

The latter signal corresponds in shape to the actual waveform of the receiver's yoke current. Accordingly, the difference amplifier provides a signal current at the emitter of transistor 80 which corresponds to the difference between the inverted sawtooth waveform and the actual waveform of current through the yoke. The circuitry coupled to the emitter of the transistor 80 drives the yoke so as to minimize that difference.

Specifically, the emitter of the transistor 80 is coupled to an amplifier 84. The output of that amplifier drives the yoke 86 for vertical deflection of the cathode ray tube (not shown).

The yoke current is coupled through a capacitor 100 and a resistor 102 to ground. Hence, the voltage across the resistor 102 corresponds to the AC current through the yoke 86. That voltage is coupled via another capacitor 104 to the emitter of the transistor 78.

DC feed back to the transistor 78 is effected by a resistor 106 coupled between the yoke 86 and the lead 82. Thus, the DC component of the yoke current is also fed back to the transistor 78. With this arrangement, the transistor 78 continuously compares the actual yoke current to the inverted sawtooth waveform on lead 64 to correct for any difference therebetween.

The inverter 52 need not, of course, be placed in the waveform generating loop between the capacitor 10a and the detector 20a. It could be placed "downstream" of that circuitry and still perform the same function. However, by positioning the inverter 52 as shown in FIG. 3, any DC drift of the inverter is nullified because the non-inverted output of the inverter is clamped to the threshold voltage $V_a$ by operation of the detector 20a.

It will be evident that the embodiments of FIGS. 1 and 3 operate in substantially the same manner, at least in the generation of the sawtooth waveform. Both require but a single capacitor for generation of that waveform. In addition, the embodiment of FIG. 3 illustrates the adaptability of the invention to fabrication in integrated circuit form.

Although the invention has been described in terms of a preferred method and structure, it will be obvious to those skilled in the art that many alterations and modifications thereto may be made without departing from the invention. Accordingly, it is intended that all such modifications and alterations be included within the scope of the invention as defined by the appended claims.

What is claimed is:

1. In a television receiver which receives vertical sync pulses as a part of a composite television signal and which includes vertical deflection circuitry responsive to an inverted sawtooth waveform, a circuit for generating an inverted sawtooth waveform for vertical deflection of a cathode ray tube's electron beam in synchronism with each such vertical sync pulse, comprising:

a capacitor for being charged and selectively discharged;

means for charging said capacitor so as to develop a ramp voltage thereacross;

a flip-flop adapted to receive a vertical sync pulse and a reset pulse for latching in a first operating condition in response to receipt of a vertical sync pulse and for latching in a second operating condition in response to receipt of a reset signal;

a transistor switch coupled between said flip-flop and said capacitor so as to discharge said capacitor in response to said first operating condition of said flip-flop and to discontinue that discharge in response to said second operating condition of said flip-flop;

a dual output inverter having an input receiving the capacitor voltage, a first output at which a non-inverted sawtooth waveform is generated and another output for coupling an inverted sawtooth waveform to the vertical deflection circuitry;

means for developing a threshold voltage; and a comparator receiving the threshold voltage and the non-inverted sawtooth waveform from the inverter's first output for clamping the latter waveform to the threshold voltage and for developing the reset signal in response to the non-inverted sawtooth waveform being substantially equal to the threshold voltage, whereby said capacitor charges to develop a ramp waveform during the interval between successive vertical sync pulses and discharges rapidly on receipt of each sync pulse to thereby develop a sawtooth waveform, and DC variations in the inverter's output are nullified by the comparator clamping the inverter's non-inverted output to the threshold voltage.

* * * * *